US010091916B2

(12) United States Patent
Braley et al.

(10) Patent No.: US 10,091,916 B2
(45) Date of Patent: Oct. 2, 2018

(54) FABRICATION OF CERAMIC MATRIX COMPOSITES WITH CARBON NANOTUBES AND GRAPHENE

(71) Applicant: The Boeing Company, Chicago, IL (US)

(72) Inventors: Daniel Joseph Braley, St. Peters, MO (US); John H. Belk, St. Louis, MO (US)

(73) Assignee: The Boeing Company, Chicago, IL (US)

( * ) Notice: Subject to any disclaimer, the term of this patent is extended or adjusted under 35 U.S.C. 154(b) by 86 days.

(21) Appl. No.: 15/279,825

(22) Filed: Sep. 29, 2016

(65) Prior Publication Data

US 2018/0092256 A1    Mar. 29, 2018

(51) Int. Cl.
| | | |
|---|---|---|
| *H05K 9/00* | (2006.01) | |
| *C04B 35/80* | (2006.01) | |
| *C04B 35/645* | (2006.01) | |
| *C04B 35/593* | (2006.01) | |
| *C04B 35/626* | (2006.01) | |

(52) U.S. Cl.
CPC ......... *H05K 9/009* (2013.01); *C04B 35/5935* (2013.01); *C04B 35/62635* (2013.01); *C04B 35/6455* (2013.01); *C04B 35/806* (2013.01); *C04B 2235/3856* (2013.01); *C04B 2235/3873* (2013.01); *C04B 2235/425* (2013.01); *C04B 2235/526* (2013.01); *C04B 2235/5248* (2013.01); *C04B 2235/5264* (2013.01); *C04B 2235/5288* (2013.01); *C04B 2235/5292* (2013.01); *C04B 2235/5436* (2013.01); *C04B 2235/5445* (2013.01); *C04B 2235/604* (2013.01); *C04B 2235/6022* (2013.01); *C04B 2235/656* (2013.01); *C04B 2235/6562* (2013.01); *C04B 2235/6567* (2013.01); *C04B 2235/661* (2013.01); *C04B 2235/77* (2013.01)

(58) Field of Classification Search
CPC .............................. H05K 9/009; C04B 35/584
See application file for complete search history.

(56) References Cited

U.S. PATENT DOCUMENTS

| | | |
|---|---|---|
| 7,897,876 B2 | 3/2011 | Tsotsis et al. |
| 8,168,291 B2 | 5/2012 | Shah et al. |
| (Continued) | | |

FOREIGN PATENT DOCUMENTS

CN        103288466 B      8/2014

OTHER PUBLICATIONS

Katsuda et al. "Reinforcement of precursor-derived Si—C—N ceramics with carbon nanotubes" Journal of the European Ceramic Society, 26, 2006, 3399-3405. (Year: 2006).*

(Continued)

*Primary Examiner* — Peter F Godenschwager
(74) *Attorney, Agent, or Firm* — Duft Bornsen & Fettig LLP (57) ABSTRACT

Systems and methods are provided for fabrication of a ceramic matrix composite (CMC) material with carbon nanotubes and graphene. One embodiment is a method for forming a ceramic matrix composite structure. The method includes providing a mixture of carbon nanotubes, graphene, and silicon carbon nitride, heating the mixture to bond the carbon nanotubes and the graphene, and sintering the silicon carbon nitride in the mixture.

19 Claims, 5 Drawing Sheets

(56) References Cited

U.S. PATENT DOCUMENTS

| | | |
|---|---|---|
| 8,715,439 B2 | 5/2014 | Chakrabarti et al. |
| 2014/0313636 A1 | 10/2014 | Tour et al. |
| 2015/0337090 A1 | 11/2015 | Sundara et al. |
| 2016/0176156 A1 | 6/2016 | Xu |

OTHER PUBLICATIONS

Mei et al. "Carbon nanotube buckypaper-reinforced SiCN ceramic matrix composites of superior electrical conductivity" Journal of the European Ceramic Society, 36, 2016, 1893-1898. (Year: 2016).*

Feng et al. "Preparation and improved electrochemical performance of SiCN-graphene composite derived from poly(silylcarbondiimide) as Li-ion battery anode" Journal of Materials Chemistry A, 2,(2014), 4168. (Year: 2014).*

Ahmad, Yazdani, and Zhu; Recent Advances on Carbon Nanotubes and Graphene Reinforced Ceramics Nanocomposites. Nanomaterials 2015, 5, 90-114.

Dr. Cheryl Xu, Strong and Flexible Ceramic Composites with High Conductivity, Florida State University.

Guangwu Zhang et al, materials, Effect of Functionalization of Graphene Nanoplatelets on the Mechanical and Thermal Properties of Silicone Rubber Composites, Materials, Feb. 2, 2016.

http://www.sciencedirect.com/science/article/pii/S0167577X11011918. Shao, Gang, et al."Ceramic nanocomposites reinforced with a high volume fraction of carbon nanofibers." Materials Letters 68 (2012): 108-111.

http://www.sciencedirect.com/science/article/pii/S1359646216302767. Jinshan Yang, Rebekah Downes, Amanda Schrand, Jin Gyu Parkb, Richard Liang, and Chengying Xu; "High electrical conductivity and anisotropy of aligned carbon nanotube nanocomposites reinforced by silicon carbonitride." Scripta Materialia, 124, 21-25 (2016).

Hvizdos, Puchy, Duszova, and Dusza; Carbon Nanofibers Reinforced Ceramic Matrix Composites; Nanofibers—Production, Properties and Functional Applications, 241-266 (2016).

Porwal, Grasso, and Reece; Review of graphene—ceramic matrix composites, Advances in Applied Ceramics, 112:8, 443-454 (2013).

Samal and Bal; Carbon Nanotube Reinforced Ceramic Matrix Composites—A Review; Journal of Minerals & Materials Characterization & Engineering, vol. 7, No. 4, pp. 355-370, 2008.

Van Thanh Dang et al, Recent trends in preparation and application of carbon nanotube-graphene hybrid thin films, Open Access IOP Publishing Vietnam Academy of Science and Technology, 2016.

Roberts, Singjai; Joining carbon nanotubes; Nanoscale, 2011, 3, 4503.

Dimitrakakis, Tylianakis, and Froudakis; Pillared Graphene: A New 3-D Network Nanostructure for Enhanced Hydrogen Storage; Nano Letters vol. 8, No. 10, 3166-3170 (2008).

Cruz-Silva et al. Edge-Edge Interactions in Stacked Graphene Nanoplatelets; American Chemical Society vol. 7, No. 3; 2834-2841 (2013).

Roberts, Singjai; Joining carbon nanotubes; Nanoscale 2011, 3, 4503-4514.

Wan et al. Synthesis of graphene—CNT hybrids via joule heating: Structural characterization and electrical transport; Carbon 53 260-268 (2013).

Huang et al. Real-Time Observation of Tubule Formation from Amorphous Carbon Nanowires under High-Bias Joule Heating; Nano Letters vol. 6, No. 8 1699-1705 (2006).

Liao et al. Reliability, Failure, and Fundamental Limits of Graphene and Carbon Nanotube Interconnects; IEEE 978-1-4799-2306 (2013).

Zhao et al. Controllable bulk growth of few-layer graphene/single-walled carbon nanotube hybrids containing Fe@C nanoparticles in a fluidized bed reactor; Carbon 67 554-563 (2014).

European Search Report; Application EP17184786; dated Jan. 22, 2018.

Jinshan Yang et al; High electrical conductivity and anisotropy of aligned carbon nanotube nanocomposites reinforcedby silicon carbonitride; Elsevier; Script Materialia 2016.

* cited by examiner

FABRICATION OF CERAMIC MATRIX COMPOSITES WITH CARBON NANOTUBES AND GRAPHENE

FIELD

The disclosure relates to the field of materials science, and in particular, to fabrication of ceramic matrix composites.

BACKGROUND

Directed energy attacks (e.g., electromagnetic pulses, lasers, etc.) can penetrate an aircraft and disrupt its internal electronics and compromise safety and communication. Frequencies of electromagnetic interference (EMI) in each of the low (<100 MHz), medium (100 MHz-1 GHz), and high (>1 GHz) ranges can be hazardous. Some aircrafts therefore use a skin made of up to two inch thick steel to protect against EMI and directed energy over all frequency ranges. However, this type of broadband protection drastically reduces flight performance and mission capability of the aircraft due to its significant weight.

Many aircrafts use a ceramic matrix composite (CMC) skin for its relatively light weight and ability to resist high temperatures, expansion, oxidation, and abrasive wear. However, the material is relatively brittle and inflexible with reduced shielding and microwave directed energy protection capability. Therefore, a need remains for flexible, lightweight aircraft material that can also protect against the broad array of directed energy threats.

SUMMARY

Embodiments described herein include fabrication of a ceramic matrix composite (CMC) material with carbon nanotubes and graphene. Conductive pathways formed between the carbon nanotubes and the graphene within the ceramic backbone results in a material that is light (e.g., 2 $g/cm^3$) with high thermal and electrical conductivity (e.g., >$3 \times 10^6$ S/m) for improved heat resistance (e.g., up to 1,000° C.) and protection against direct energy threats. The combination of the ceramic, carbon nanotubes, and graphene also enables fabrication of flexible sheets moldable to the curvatures of an aircraft body that are resistant to shock and directed energy threats with no degradation in mechanical strength.

One embodiment is a method for forming a ceramic matrix composite structure. The method includes providing a mixture of carbon nanotubes, graphene, and silicon carbon nitride. The method further includes heating the mixture to bond the carbon nanotubes and the graphene, and sintering the silicon carbon nitride in the mixture.

Another embodiment is a ceramic matrix composite material comprising carbon nanotubes, graphene chemically bonded to the carbon nanotubes, and silicon carbon nitride sintered in a mixture with the carbon nanotubes and the graphene.

Other exemplary embodiments may be described below. The features, functions, and advantages that have been discussed can be achieved independently in various embodiments or may be combined in yet other embodiments, further details of which can be seen with reference to the following description and drawings.

DESCRIPTION OF THE DRAWINGS

Some embodiments of the present disclosure are now described, by way of example only, and with reference to the accompanying drawings. The same reference number represents the same element or the same type of element on all drawings.

DESCRIPTION

The figures and the following description illustrate specific exemplary embodiments of the disclosure. It will thus be appreciated that those skilled in the art will be able to devise various arrangements that, although not explicitly described or shown herein, embody the principles of the disclosure and are included within the scope of the disclosure. Furthermore, any examples described herein are intended to aid in understanding the principles of the disclosure, and are to be construed as being without limitation to such specifically recited examples and conditions. As a result, the disclosure is not limited to the specific embodiments or examples described below, but by the claims and their equivalents.

Figure 1:
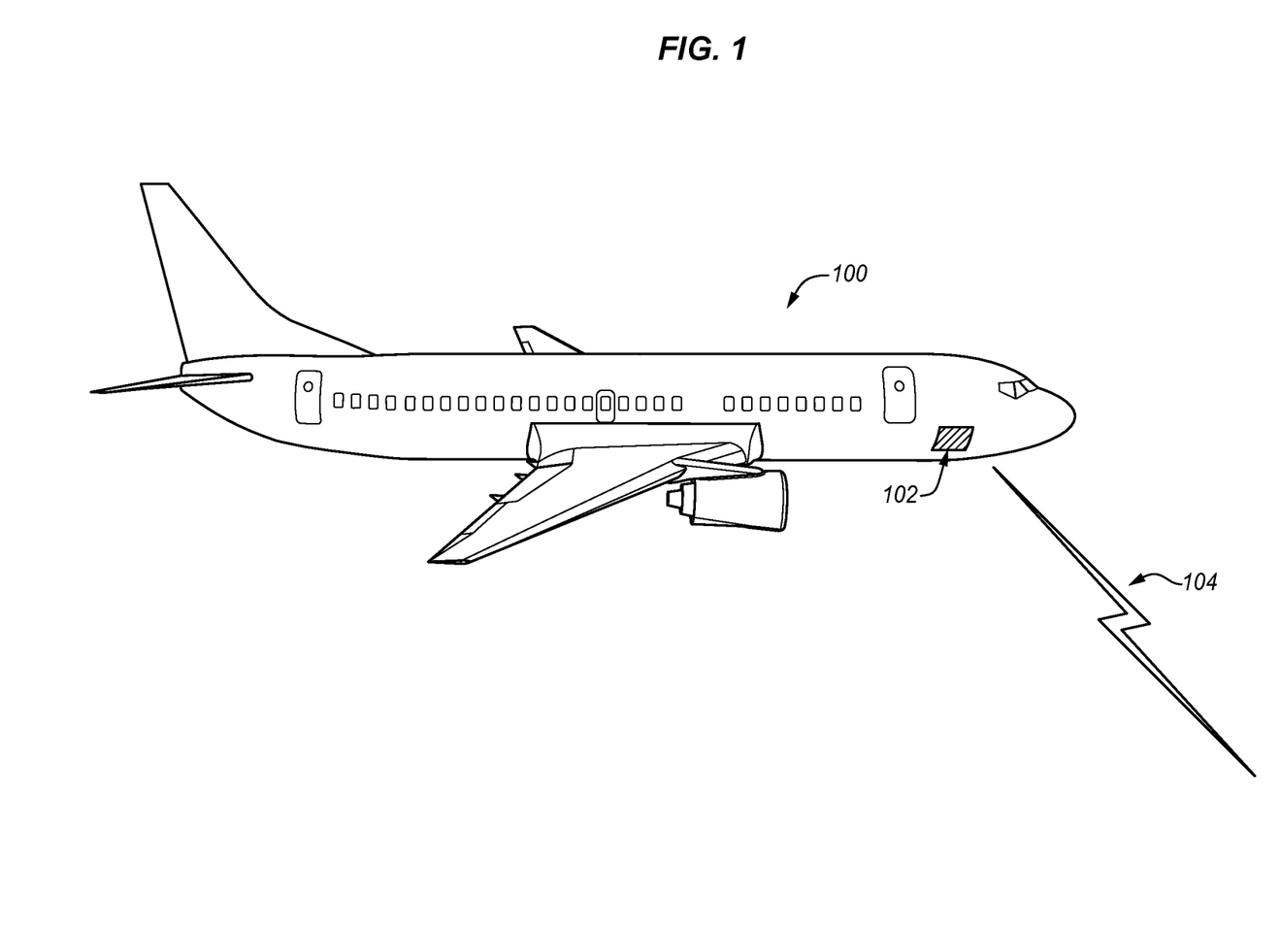
FIG. 1 illustrates an aircraft in an exemplary embodiment.

FIG. 1 illustrates an aircraft 100 in an exemplary embodiment. Aircraft 100 may comprise any object capable of flight, including airplanes, drones, missiles, vehicles, satellites, etc., and may be operated manned or unmanned as desired. Aircraft 100 includes a ceramic matrix composite (CMC) material 102 in the form of one or multiple sheets that cover the aircraft 100 or at least a section or component thereof. The CMC material 102 provides a structure that shelters the interior of the aircraft from elements in the external environment, including direct energy 104 threats in the form of high power microwave energy, electromagnetic pulses, high power lasers, nuclear attacks, etc. The directed energy 104 may include radio frequencies (RF) in the low (<100 MHz), medium (100 MHz-1 GHz), and/or high (>1 GHz) range.

The term "ceramic matrix composite" generally refers to a composite created from interleaving fibers bound in a ceramic matrix. CMC material is recognized for its light weight and resistance to high temperatures, expansion, oxidation, and abrasive wear, making it a useful composite skin material in aerospace applications. However, conventional CMC material is also relatively brittle and inflexible with poor shielding effectiveness. More recent research efforts describe techniques for reinforcing the ceramic with multiwall carbon nanotubes in a manner that improves abrasion and heat resistance, but the material remains limited in improvements to strength, flexibility and protection against medium to high frequencies, and provides little or no protection from high power microwave energy (e.g., generally 300 MHz to 300 GHz).

Figure 2:
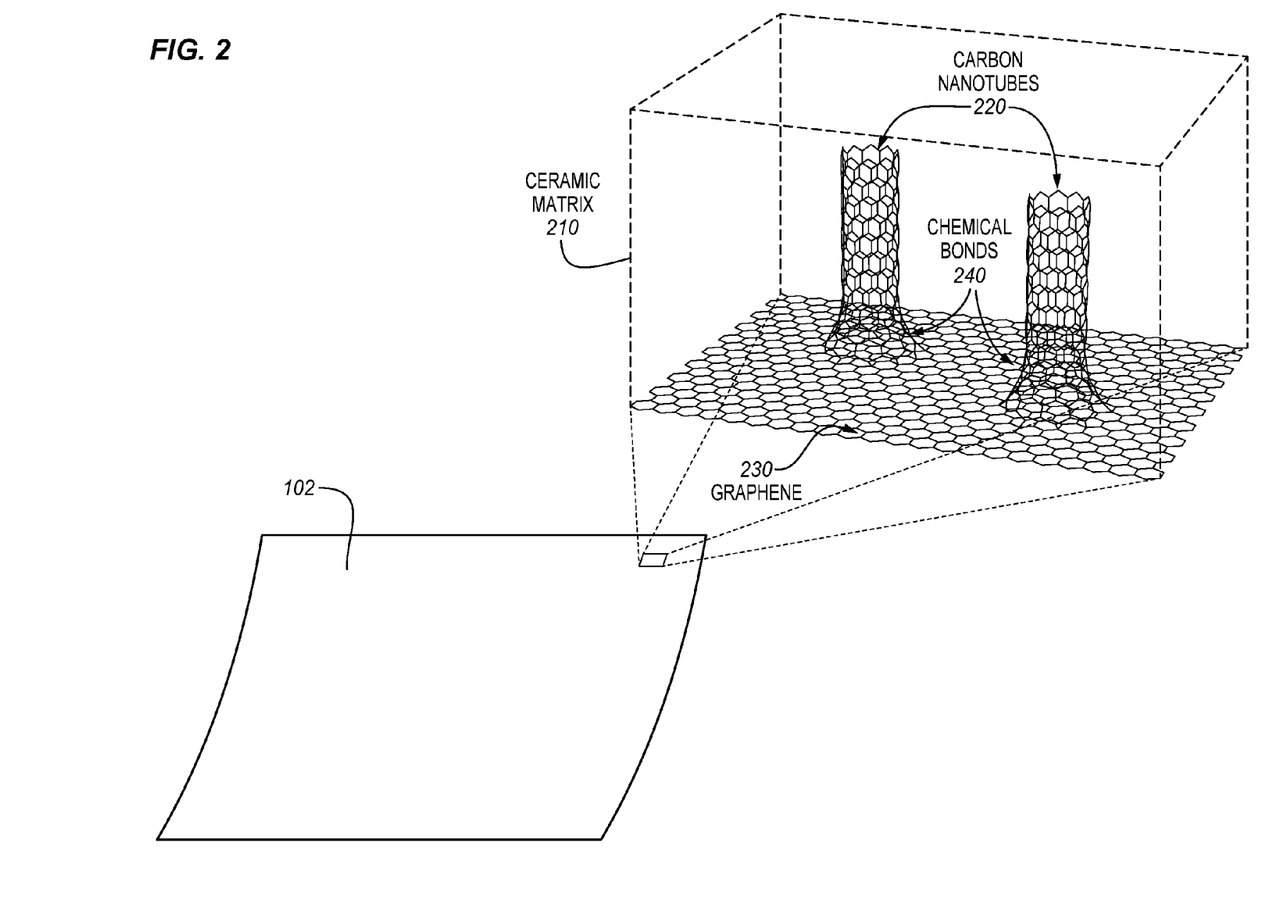
FIG. 2 illustrates ceramic matrix composite material in an exemplary embodiment.

The CMC material 102 is therefore enhanced to include a composition that provides improved flexibility, toughness, impact resistance, and shielding effectiveness at medium and high frequency ranges to adequately protect against directed energy 104 threats and prevent electronic disruption of the aircraft 100. FIG. 2 illustrates the CMC material 102 in an exemplary embodiment. The CMC material 102 includes a combination of a ceramic matrix 210, carbon nanotubes 220, and graphene 230. Carbon nanotubes 220 and graphene 230 are both carbon materials that exhibit high electrical conductivity and large specific surface areas. In the CMC material 102, the ceramic backbone provided by the ceramic matrix 210 is enhanced by the formation of chemical bonds 240 between carbon nanotubes 220 and graphene 230 to increase the conductive cross section of the CMC material 102 and improve its energy absorption and heat dissipation. Additionally, the presence and dispersion of graphene 230 adds microwave (e.g., 300 MHz-300 GHz) absorption capability and flexibility to the CMC material 102 and further enhances other characteristics already provided by the ceramic matrix 210 and carbon nanotubes 220, including energy absorption at medium to high frequencies.

The ceramic matrix 210 may include matrices formed from any suitable ceramic, including but not limited to carbide-, nitride-, oxide-, and boride-based ceramics, such as silicon carbon nitride (SiCN), silicon nitride, silicon carbide, alumina, etc. The ceramic matrix 210 may comprise microstructures formed by sintering and consolidating a fine powder. In one embodiment, the ceramic matrix 210 component of the CMC material 102 is formed from a fine powder of SiCN with particle size diameters ranging from 0.1 micrometers (μm) to 1.0 μm. The CMC material 102 may therefore be fabricated using powdered SiCN rather than by pyrolysis of precursor chemicals. Fabrication using powdered SiCN advantageously supports a dispersion in reaching a homogenized state and helps avoid particle agglomeration so that the casting/pressing operations may form a uniform green body ready to be sintered for production of a sheet of CMC material 102.

Carbon nanotubes 220 generally comprise hollow, cylindrical structures of pure carbon-based polymers which impart unique mechanical, electrical, and chemical properties to the CMC material 102 depending on their particular shape and dimensions. The prefix "nano-" as used herein generally refers to dimensions that are less than 100 nanometers (nm). Carbon nanotubes 220 may comprise "ropes" or bundles of nanotubes held together along their lengths by van der Waals forces which branch and join adjacent nanotubes. Alternatively or additionally, carbon nanotubes 220 may comprise single-wall carbon nanotubes, multi-wall carbon nanotubes, fullerene pipes, or other nanostructures or combinations thereof. In one embodiment, carbon nanotubes 220 in the CMC material 102 comprise single-wall carbon nanotubes having a length ranging between 0.5 millimeters (mm) and 4 mm and a diameter between 1 nm and 50 nm. In another embodiment, carbon nanotubes 220 may comprise a mixture of single-wall carbon nanotubes (e.g., to provide electrical/thermal conductivity) and multi-wall carbon nanotubes (e.g., to provide bulk carbon for the connection growth process).

Graphene 230 generally comprises an allotrope of carbon in the form of a thin planar sheet of sp2-bonded carbon atoms in a honeycomb crystal lattice. In one embodiment, graphene 230 comprises graphene platelets forming stacks of multiple graphene sheets of nanoscale thickness. Graphene 230 may alternatively or additionally comprise nanographene platelets with platelet sizes ranging between 6 nm and 8 nm thick, and 5μ and 25μ wide.

Figure 3:
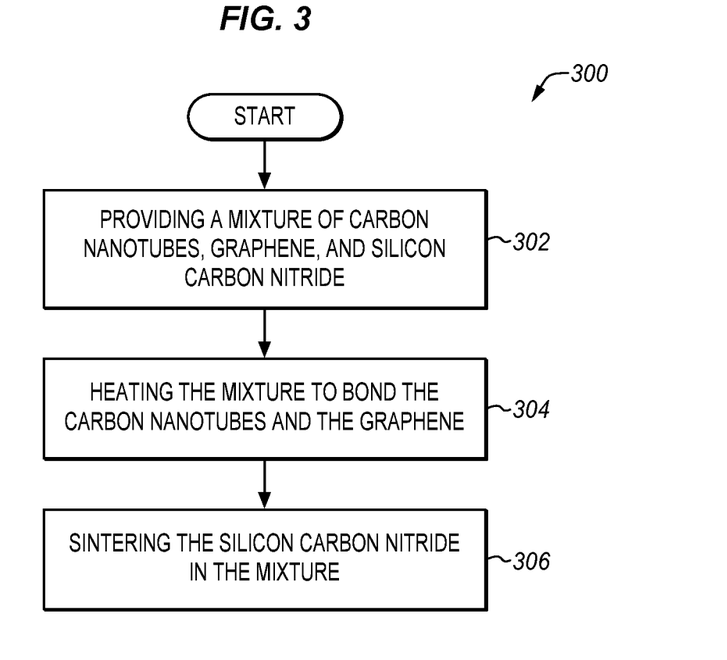
FIG. 3 is a flowchart illustrating a method for fabricating the CMC material in an exemplary embodiment.

Illustrative details for fabricating the CMC material 102 having the above-described materials and attributes are described below. FIG. 3 is a flowchart illustrating a method 300 for fabricating the CMC material 102 in an exemplary embodiment. The steps of the flowcharts described herein are not all inclusive, may include other steps not shown, and may be performed in alternative orders.

In step 302, a mixture of carbon nanotubes 220, graphene 230, and SiCN is provided. Each material may be obtained from a commercial source or developed/prepared according to any number of suitable techniques. For example, carbon nanotubes 220 may be prepared by arc discharge between carbon electrodes in an inert gas atmosphere and/or graphene 230 may be prepared by associating a graphene film with a substrate and an applied catalyst. In one embodiment, carbon nanotubes 220 may be produced with catalysts which leave behind impurities (e.g., $Fe_2O_3$) and these catalysts and/or additional catalysts may be used to enhance the growth and connection of carbon nanotubes 220 to graphene 230.

In step 304, the mixture is heated to bond the carbon nanotubes 220 and the graphene 230. In doing so, the mixture may be compacted and cured using a heated press, autoclave, furnace, vacuum, etc. Heating the mixture of the constituent materials at a predetermined temperature for a predetermined duration assures formation of covalent bonds at junctions between carbon nanotubes 220 and graphene 230.

In step 306, the SiCN in the mixture is sintered. In doing so, the mixture may be further heated using one or more of the above techniques to cause sintering of the ceramic provided for the mixture. The result is the CMC material 102 having hybrid ceramic composite structure that is that is flexible and light (e.g., 2 g/cm$^3$) with high thermal and electrical conductivity (e.g., $>3 \times 10^6$ S/m) for improved heat resistance (e.g., up to 1,000° C.) and protection against directed energy 104 threats.

Figure 4:
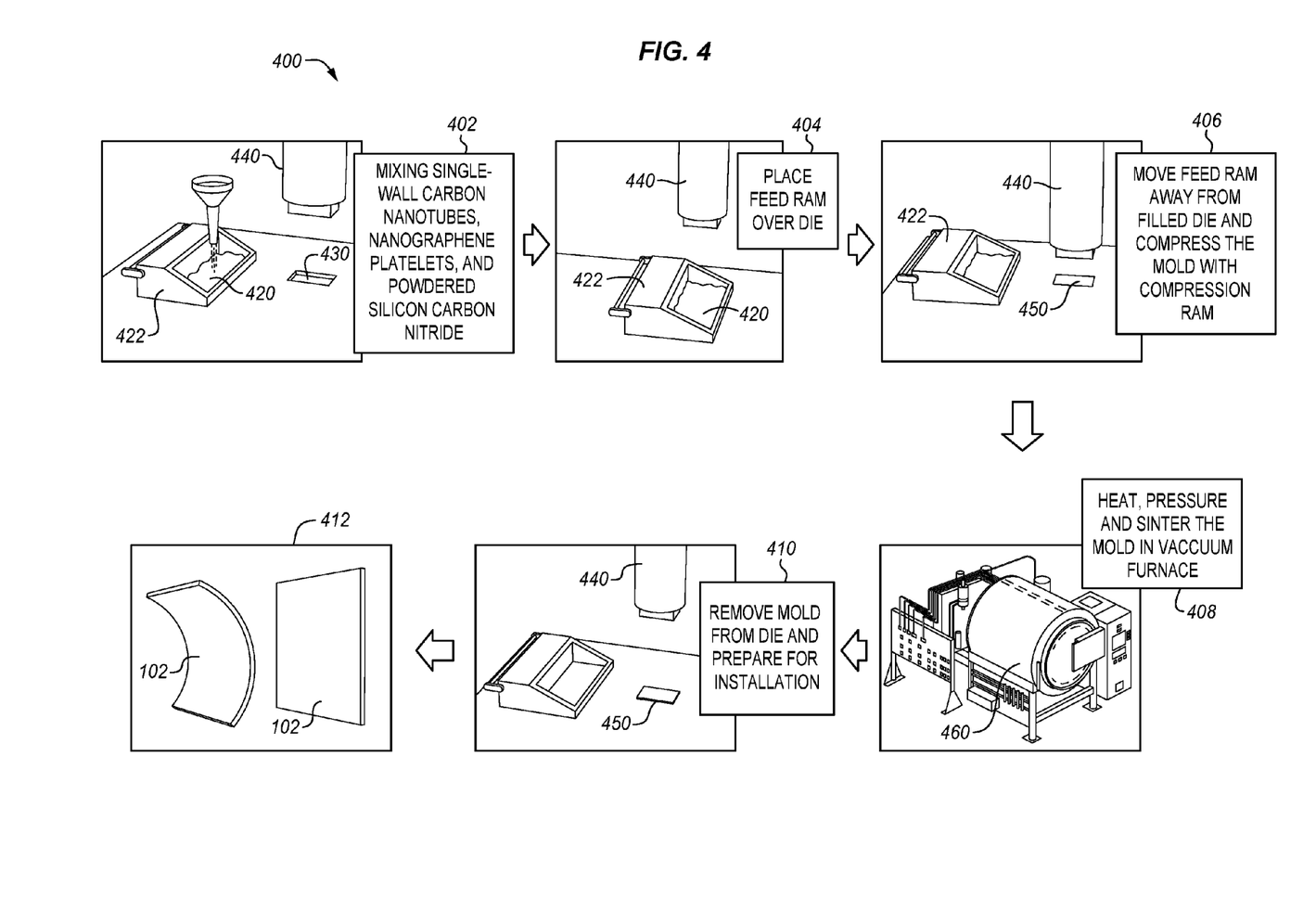
FIG. 4 illustrates a manufacturing system and method for fabricating the CMC material 102 in an exemplary embodiment.

FIG. 4 illustrates a manufacturing system and method 400 for fabricating the CMC material 102 in an exemplary embodiment. The steps described herein are not all inclusive, may include other steps not shown, and may be performed in alternative orders. Additionally, components of the fabrication system described herein are exemplary for illustration purposes and may include alternative or additional manufacturing tools or techniques.

Assume, for this embodiment, that the starting materials for fabrication of the CMC material 102 include single-wall carbon nanotubes, graphene platelets, and SiCN powder. Further assume for this embodiment, that the fabrication system includes a feed ram 422, die 430, compression ram 440, and a vacuum furnace 460. As shown in step 402, the single-wall carbon nanotubes, graphene platelets, and SiCN powder are mixed. The resulting mixture 420 may be provided in the feed ram 422.

The relative proportions and/or amounts of ceramic material, single-wall carbon nanotubes, and graphene platelets may vary according the desired performance characteristics in the resulting CMC material 102. In one embodiment, the mixture used to form the CMC material 102 comprises single-wall carbon nanotubes at approximately 20% by weight, graphene platelets at approximately 20% by weight, and SiCN in a powder form at approximately 60% by weight. Accordingly, the mixture may be approximately 2.1 g/cm$^3$ and comprise single-wall carbon nanotubes at approximately 0.42 g/cm$^3$, graphene at approximately 0.42 g/cm$^3$, and SiCN at approximately 1.26 g/cm$^3$. In another embodiment, the mixture may comprise single-wall carbon nanotubes in a range of 10-30% by weight, graphene platelets in a range of 10-30% by weight, and SiCN in a powder form in a range of 60-80% by weight, with a combined weight of the single-wall carbon nanotubes and the graphene platelets being less than 40% by weight. Accordingly, the mixture may comprise single-wall carbon nanotubes in a range of 0.21 g/cm$^3$ to 0.63 g/cm$^3$, graphene platelets in a range of 0.21 g/cm$^3$ to 0.63 g/cm$^3$, and SiCN in a range of 1.26 g/cm$^3$ to 1.68 g/cm$^3$. In another embodiment, the particle size of the powdered SiCN may be range from 0.1 µm to 1.0 µm, with an upper limit established by sintering thermodynamics and a lower limit selected to avoid particle flocculation. In another embodiment, the particle size of the powdered SiCN may range from 1 µm to 100 µm to accommodate availability of raw ceramic materials in larger chunks and/or lower quality. In yet another embodiment, graphene platelets comprise a bulk density between 0.03 grams per cubic centimeter (g/cm$^3$) and 0.1 g/cm$^3$, an oxygen content of less than 1%, a carbon content greater than 99.5% by weight, and a residual acid content less than 0.5% by weight.

Mixing of the single-wall carbon nanotubes, graphene platelets, and SiCN powder may include mechanical mixing (e.g., ball-milling) and/or involve the use of suspension of one or multiple materials in a liquid suspending medium. Therefore, step 402 may alternatively or additionally include providing a suspension for the mixture to form a dispersion and/or mixing the dispersion. In one particular embodiment, the suspension is approximately 10% by weight $PS_4$ (an acid based surfactant that is soluble in ketones) and ethanol. This suspension leads to decreased sedimentation height and an increased dispersion of the SiCN particles to aid in sintering of the ceramic. This suspension also avoids reagglomeration of the SiCN particles and aids in stabilizing the suspension. Thus, the resulting dispersion may be mixed using a Turbula Shaker-Mixer and an ultrasonic probe until the dispersion reaches homogenization (generally no more than thirty minutes but may depend on batch volume).

In step 404, the feed ram 422 with the mixture 420 is placed over a die 430. Thus, the dispersion may be poured over a plaster mold to eliminate liquid by capillarity. The process of removing the liquid by capillarity may take approximately 48 hours. The result is a deagglomerated mold 450 ready for casting/pressing.

In step 406, the feed ram 422 is moved away from the die 430 filled with the mold 450 and the compression ram 440 compresses the mold 450. The compression ram 460 may hot press the mold 450 at a predetermined temperature, pressure, and time to form a green body ready for sintering. During this stage, van der Walls forces may become apparent between single-wall carbon nanotubes the graphene platelets at temperatures as low as 250 degrees Fahrenheit and a pressure around 100 pounds per square inch (psi). In one embodiment, the compression ram 440 hot presses the mold at approximately 5,000 psi and 250 degrees Celsius with approximately 1 atm of applied Nitrogen to form a green body.

In step 408, the vacuum furnace 460 heats, pressurizes, and sinters the mold 450. The vacuum furnace 460 may additionally process the mold 450 in an atmosphere of Nitrogen, Nitrogen/Argon, NaCl, or some combination therefore to support the chemical bonding between the single-wall carbon nanotubes and the graphene platelets. Chemical bonding between the single-wall carbon nanotubes and the graphene platelets may occur between 750 degrees Celsius and 950 degrees Celsius. Thus, the vacuum furnace 460 may heat the mold 450 to a first temperature that is between 750 degrees Celsius and 950 degrees to initiate the chemical bonding between the carbon nanotubes and the graphene.

Conventional techniques for sintering SiCN apply heat at approximately 1,300 degrees Celsius and pressure at approximately 217 psi. However, oxidation of graphene (and thus formation of graphite) may occur at temperatures above 1,000 degrees Celsius and result in a degradation of properties. Accordingly, for the mold 450 comprising mixture 420, the vacuum furnace 460 may apply an increased pressure to the mold 350 to cause sintering of the SiCN at a temperature between 750 degrees Celsius and 950 degrees Celsius. This allows formation of covalent transformation of sp-2 carbon bonds between the single-wall carbon nanotubes and the graphene platelets while preventing oxidation of the graphene that otherwise occurs at 1,000 degrees Celsius or greater. Thus, after initiating chemical bonding between the carbon nanotubes and the graphene at a first temperature between 750 degrees Celsius and 950 degrees, the vacuum furnace 460 may pressurize the mold 350 at a second temperature that is higher than the first temperature to cause the SiCN to sinter at a temperature that is below 1,000 degrees Celsius. To do this, the vacuum furnace 460 may, for instance, pressurize the mold 350 in a range between 297 psi to 376 psi to cause sintering of the SiCN between 750 degrees Celsius and 950 degrees Celsius, respectively. This enables covalent transformation of sp2- carbon between graphene platelets and the single-wall carbon nanotubes within sintered SiCN (e.g. covalent C—C bonding between graphene 230 layers and carbon nanotubes 220 within ceramic matrix 210). The result is a CMC material 102 comprising a ceramic matrix 210 of powdered SiCN, carbon nanotubes 220, and graphene 230 prevented from oxidation, and with the improved mechanical, electrical, and electromagnetic properties already described above.

In one embodiment, the vacuum furnace 460 heats the green body at a rate of 1-14 degrees Celsius with linear ramp up for a time that is based on a temperature for sintering the SiCN to form the ceramic matrix 210 of the CMC material 102. For example, if the sintering temperature is set at 800 degrees Celsius, the single-wall carbon nanotubes may begin bonding to the graphene platelets near 750 degrees Celsius and as the heat increases to 800 degrees Celsius true sintering may begin to occur. Thus, the vacuum furnace 460 may apply 750 degrees Celsius and 376 psi at heating rate of 1-14 degrees Celsius for 1-13 hours with linear ramp up, or alternatively, apply 950 degrees Celsius and 297 psi at heating rate of 1-14 degrees Celsius for 1-16 hours with linear ramp up. After the maximum temperature is reached, the vacuum furnace 460 may maintain a constant maximum temperature for the green body for 3-8 hours.

In step 410, the mold 450 is removed from the die 430 and prepared for installation. For instance, the edges of the finished hybrid ceramic may be sanded in preparation for paint application and/or machined off of the panel so it may be appropriately installed. The result is the flexible sheet of CMC material 102 shown in 412 which may be used in any application where a ceramic material with enhanced strength, flexibility, thermal resistance, and/or energy barrier properties is desired.

Figure 5:
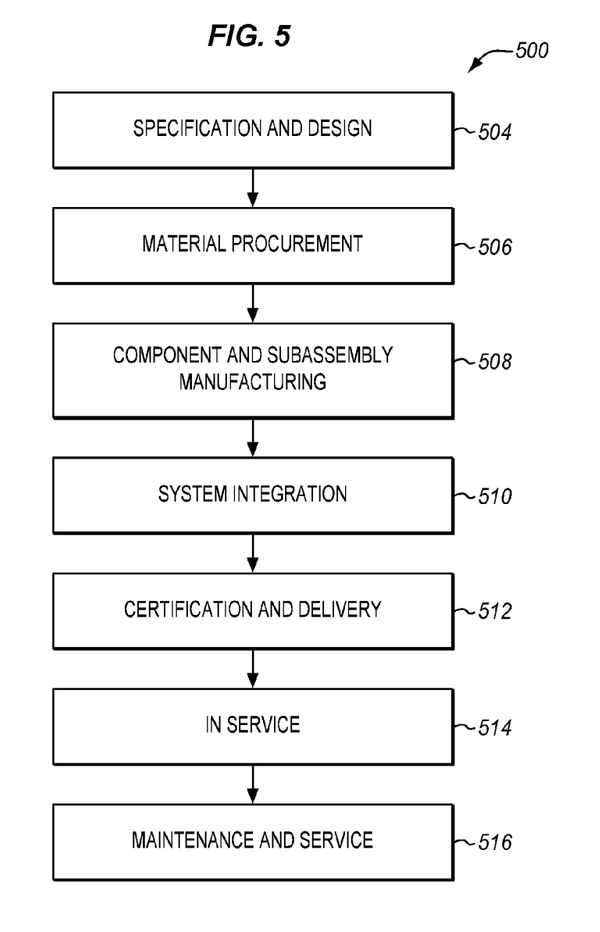
FIG. 5 is a flow diagram of aircraft production and service methodology in an exemplary embodiment.
Figure 6:
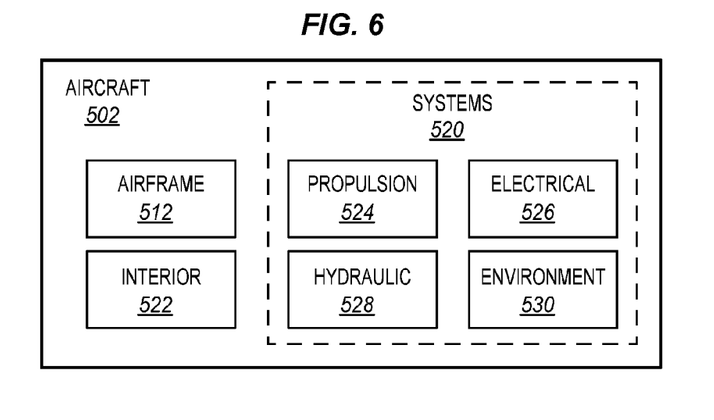
FIG. 6 is a block diagram of an aircraft in an exemplary embodiment.

A specific application for high-performance CMC material 102 is in aircraft production. Referring more particularly to the drawings, embodiments of the disclosure may be described in the context of an aircraft manufacturing and service method 500 as shown in FIG. 5 and an aircraft 502 as shown in FIG. 6. During pre-production, exemplary method 500 may include specification and design 504 of the aircraft 502 and material procurement 506. During production, component and subassembly manufacturing 508 and system integration 510 of the aircraft 502 takes place. Thereafter, the aircraft 502 may go through certification and delivery 512 in order to be placed in service 514. While in service by a customer, the aircraft 502 is scheduled for routine maintenance and service 516 (which may also include modification, reconfiguration, refurbishment, and so on).

Each of the processes of method 500 may be performed or carried out by a system integrator, a third party, and/or an operator (e.g., a customer). For the purposes of this description, a system integrator may include without limitation any number of aircraft manufacturers and major-system subcontractors; a third party may include without limitation any number of vendors, subcontractors, and suppliers; and an operator may be an airline, leasing company, military entity, service organization, and so on.

As shown in FIG. 6, the aircraft 502 produced by exemplary method 500 may include an airframe 518 with a plurality of systems 520 and an interior 522. Examples of high-level systems 520 include one or more of a propulsion system 524, an electrical system 526, a hydraulic system 528, and an environmental system 530. Any number of other systems may be included. Although an aerospace example is shown, the principles of the invention may be applied to other industries, such as the automotive industry.

Apparatus and methods embodied herein may be employed during any one or more of the stages of the production and service method 500. One or more apparatus embodiments, method embodiments, or a combination thereof may be utilized during the production stages 508 and 510. Similarly, one or more of apparatus embodiments, method embodiments, or a combination thereof may be utilized while the aircraft 502 is in service, for example and without limitation, to maintenance and service 516. For example, the techniques and systems described herein may be used for steps 506, 508, 510, 514, and/or 516, and/or may be used for airframe 518 and/or interior 522, or even any of propulsion 1924, electrical 1926, environmental 1930, hydraulic 1928, or systems 1920 in general.

In one embodiment, the CMC material 102 comprises a portion of airframe 118 (e.g., a portion of a composite part utilized for a wing of an aircraft), and is manufactured during component and subassembly manufacturing 508. The CMC material 102 may be assembled together with other layers into a composite part for an aircraft in system integration 510, and then be utilized in service 514 until wear renders the part unusable. Then, in maintenance and service 516, the part may be discarded and replaced with a newly manufactured part including a new CMC material 102.

Any of the various control elements shown in the figures or described herein may be implemented as hardware, software, firmware, or some combination of these. For example, an element may be implemented as dedicated hardware. Dedicated hardware elements may be referred to as "processors", "controllers", or some similar terminology. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, a network processor, application specific integrated circuit (ASIC) or other circuitry, field programmable gate array (FPGA), read only memory (ROM) for storing software, random access memory (RAM), non-volatile storage, logic, or some other physical hardware component or module.

Also, an element may be implemented as instructions executable by a processor or a computer to perform the functions of the element. Some examples of instructions are software, program code, and firmware. The instructions are operational when executed by the processor to direct the processor to perform the functions of the element. The instructions may be stored on storage devices that are readable by the processor. Some examples of the storage devices are digital or solid-state memories, magnetic storage media such as a magnetic disks and magnetic tapes, hard drives, or optically readable digital data storage media.

Although specific embodiments are described herein, the scope of the disclosure is not limited to those specific embodiments. The scope of the disclosure is defined by the following claims and any equivalents thereof.

The invention claimed is:

1. A method for forming a ceramic matrix composite structure, the method comprising:
   providing a mixture of carbon nanotubes, graphene, and silicon carbon nitride;
   heating the mixture to bond the carbon nanotubes and the graphene; and
   sintering the silicon carbon nitride in the mixture.

2. The method of claim 1 further comprising:
   heating the mixture to a first temperature to initiate chemical bonding between the carbon nanotubes and the graphene; and
   pressurizing the mixture during heating of the mixture at a second temperature to cause the sintering of the silicon carbon nitride in the mixture at a temperature that is below 1,000 degrees Celsius.

3. The method of claim 2 wherein:
   the first temperature is between 750 degrees Celsius and 950 degrees Celsius;
   the second temperature is higher than the first temperature;
   the sintering of the silicon carbon nitride in the mixture occurs after the heating to the first temperature to initiate the chemical bonding between the carbon nanotubes and the graphene; and
   the pressurizing of the mixture occurs in a pressure range between 297 psi to 376 psi to prevent oxidation of the graphene and formation of graphite that otherwise occurs at 1,000 degrees Celsius or greater.

4. The method of claim 2 further comprising:
   pressurizing the mixture in an autoclave that applies at least one of Nitrogen, Nitrogen/Argon, or NaCl to the mixture to support the chemical bonding between the carbon nanotubes and the graphene.

5. The method of claim 2 further comprising:
   providing a suspension for the mixture to form a dispersion;
   mixing the dispersion;
   pouring the dispersion in a mold; and
   hot pressing the mold to form a green body.

6. The method of claim 5 further comprising:
   mixing the dispersion with a Turbula Shaker-Mixer and an ultrasonic probe; and
   hot pressing the mold at approximately 5,000 psi and 250 degrees Celsius with approximately 1 atm of applied Nitrogen to form the green body;
   wherein the suspension is approximately 10% by weight $PS_4$ and ethanol.

7. The method of claim 5 further comprising:
   heating the green body at a rate of 1-14 deg. C per hour for 1-16 hours; and
   maintaining a constant maximum temperature for the green body for 3-8 hours to form the ceramic matrix composite structure.

8. The method of claim 1 wherein:
the carbon nanotubes comprise single-wall carbon nanotubes having a length between 0.5 millimeters to 4 millimeters and a diameter between 1 nanometer and 50 nanometers, the carbon nanotubes being in a range of 10-30% by weight in the mixture;
the graphene comprises nanographene platelets having a platelet size that is 6-8 nm thick and 5-25 microns wide, the graphene being in a range of 10-30% by weight in the mixture;
the silicon carbon nitride comprises a powder having particle sizes between 0.1 and 1 micrometers in diameter, the silicon carbon nitride being in a range of 60-80% by weight; and
a combined weight of the carbon nanotubes and the graphene in the mixture is less than 40% by weight.

9. A ceramic matrix composite material comprising:
carbon nanotubes;
graphene chemically bonded to the carbon nanotubes; and
silicon carbon nitride sintered in a mixture with the carbon nanotubes and the graphene.

10. The ceramic matrix composite material of claim 9 comprising:
the carbon nanotubes at approximately 20% by weight;
the graphene at approximately 20% by weight; and
the silicon carbon nitride in a powder form at approximately 60% by weight.

11. The ceramic matrix composite material of claim 9 comprising:
the carbon nanotubes in a range of 10-30% by weight;
the graphene in a range of 10-30% by weight; and
the silicon carbon nitride in a powder form in a range of 60-80% by weight;
wherein a combined weight of the carbon nanotubes and the graphene in the mixture is less than 40% by weight.

12. The ceramic matrix composite material of claim 9 wherein:
the ceramic matrix composite material is approximately 2.1 g/cm$^3$;
the carbon nanotubes are approximately 0.42 g/cm$^3$;
the graphene is approximately 0.42 g/cm$^3$; and
the silicon carbon nitride is approximately 1.26 g/cm$^3$.

13. The ceramic matrix composite material of claim 9 comprising:
the carbon nanotubes in a range of 0.21 g/cm$^3$ to 0.63 g/cm$^3$;
the graphene in a range of 0.21 g/cm$^3$ to 0.63 g/cm$^3$; and
the silicon carbon nitride in a range of 1.26 g/cm$^3$ to 1.68 g/cm$^3$;
wherein a combined weight of the carbon nanotubes and the graphene is less than 40% by weight.

14. The ceramic matrix composite material of claim 9 wherein:
the carbon nanotubes comprise single-wall carbon nanotubes having a length between 0.5 millimeters to 4 millimeters and a diameter between 1 nanometer and 50 nanometers.

15. The ceramic matrix composite material of claim 9 wherein:
the graphene comprises nanographene platelets having a platelet size that is 6-8 nm thick and 5-25 microns wide.

16. The ceramic matrix composite material of claim 9 wherein:
prior to sintering, the silicon carbon nitride comprises a powder having particle sizes between 0.1 and 1 micrometers in diameter.

17. The ceramic matrix composite material of claim 9 wherein:
the carbon nanotubes and the graphene are chemically bonded at a first temperature between 750 degrees Celsius and 950 degrees Celsius.

18. The ceramic matrix composite material of claim 17 wherein:
the silicon carbon nitride is sintered at a second temperature that is higher than the first temperature.

19. The ceramic matrix composite material of claim 18 wherein:
the silicon carbon nitride is sintered at a pressure between 297 psi and 376 psi.

* * * * *